(12) United States Patent
Cho et al.

(10) Patent No.: US 6,601,643 B2
(45) Date of Patent: Aug. 5, 2003

(54) FLAT EVAPORATOR

(75) Inventors: Kyung-il Cho, Seoul (KR); Hye-jung Cho, Kyungki-do (KR); Jae-yong Lee, Kyungki-do (KR); In-seob Song, Kyungki-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 10/131,255

(22) Filed: Apr. 25, 2002

(65) Prior Publication Data

US 2003/0106671 A1 Jun. 12, 2003

(30) Foreign Application Priority Data

Apr. 27, 2001 (KR) ........................................ 2001-22978
Apr. 3, 2002 (KR) ........................................ 2002-18227

(51) Int. Cl.[7] .............................................. F28D 7/02
(52) U.S. Cl. ............................ 165/104.26; 165/104.33; 361/700; 174/15.2; 257/715
(58) Field of Search ........................... 165/80.4, 104.26, 165/104.33; 361/700; 257/715, 716; 174/15.2

(56) References Cited

U.S. PATENT DOCUMENTS

| | | | |
|---|---|---|---|
| 4,046,190 A | * 9/1977 | Marcus et al. | ......... 165/104.26 |
| 5,725,049 A | 3/1998 | Swanson et al. | |
| 6,167,948 B1 | * 1/2001 | Thomas | ................. 165/104.26 |
| 6,382,309 B1 | * 5/2002 | Kroliczek et al. | ..... 165/104.26 |
| 6,443,222 B1 | * 9/2002 | Yun et al. | .............. 165/104.26 |

* cited by examiner

*Primary Examiner*—Henry Bennett
*Assistant Examiner*—Terrell McKinnon
(74) *Attorney, Agent, or Firm*—Burns, Doane, Swecker & Mathis, L.L.P.

(57) ABSTRACT

A flat evaporator is provided. In the evaporator, a common chamber formed on a substrate with a predetermined diameter and depth for containing a coolant is divided into a vaporization cavity region, a capillary region surrounding the vaporization cavity region, and a manifold region surrounding the capillary region. The capillary region has a capillarity generator capable of generating capillary action, and a top plate is configured to include an exhaust unit including a gas collector to exhaust a gas coolant generated in the vaporization cavity region. Also, the evaporator includes an auxiliary capillarity generator having a plurality of pins extending towards the center of the vaporization cavity region between the top plate and the substrate. The evaporator can be implemented as a small cooling device for performing cooling without external power. Furthermore, the evaporator can effectively prevent degradation of fluid flow force due to coexistence of gas and liquid by isolating a liquid coolant from a vaporized coolant by a capillary region, thereby significantly improving heat exchange characteristics.

20 Claims, 6 Drawing Sheets

FLAT EVAPORATOR

Priority is claimed to Patent Application Numbers 2001-22978 filed in Rep. of Korea on Apr. 27, 2001 and 2002-18227 filed on Apr. 3, 2002, herein incorporated by reference.

BACKGROUND OF THE INVENTION

1. Field of the Invention

The present invention relates to an evaporator having a structure for circulating working fluids by capillary action, and more particularly, to a flat evaporator having a capillarity generator that surrounds a vaporization cavity region.

2. Description of the Related Art

As electronic technologies have advanced, electronic devices tend to be designed as modules and have smaller dimensions and higher output capabilities. Heat generated per unit area of electronic devices continues to increase accordingly. Thus, it is of great concern to properly control heat generated in electronic devices in designing and operating the electronic devices. There are several well-known techniques for controlling temperature in electronic devices including: thermal conduction, natural convection/radiation or forced convection of air, cooling by a liquid, immersion, distribution of heat through heat pipes.

A capillary pumped loop (CPL), which has recently been developed, is a system in which surface tension at boundaries where phase change of a coolant occurs is used as a driving source for transporting the coolant. A cooling system employing this CPL includes an evaporator for transferring heat from a heat source using a gas coolant and a condenser for condensing the gas coolant output from the evaporator into a liquid.

CPL evaporators must be constructed such that heat generated from a heat source effectively promotes phase change of a coolant and that boundaries where phase change of the coolant occurs are evenly distributed around a heat source since surface tension at the boundaries is a driving source for transporting the coolant.

A cooling system devised by Stenger of NASA Lewis Center is constructed by a loop in which a coolant flows through a pipe. The loop consists of an evaporator portion having a porous structure that generates capillary action on a path along which the coolant flows at one end of the pipe. The loop is configured to condense the coolant by giving up heat at the other end of the pipe. Since it is difficult to make the pipe loop smaller, this structure is not suitable for electronic instruments or equipment of smaller dimensions.

U.S. Pat. No. 5,725,049 by Swanson et al., describes a flat heat exchanger employing a CPL. The heat exchanger proposed in the above patent includes an evaporator, a condenser, a liquid tube, and a vapor tube. The evaporator has top and bottom bodies, and a porous structure between the top and bottom bodies thereof. Grooves connected to the liquid tube are formed in a top portion of the porous structure, and grooves connected to the vapor tube are formed in a bottom portion thereof. The heat exchanger is configured so that a liquid coolant supplied from a central portion of the top grooves of the porous structure disperses into adjacent grooves to vaporize the liquid coolant through the porous structure thereby outputting vapor to the vapor tube through the bottom grooves thereof. However, because its structure, the heat exchanger cannot be used as a cooling device for a heat source having a small surface area but high heat generation or a small thin cooling device.

SUMMARY OF THE INVENTION

To solve the above problems, it is an object of the present invention to provide a flat evaporator having small dimensions.

It is another object of the present invention to provide a flat evaporator with small dimensions having high cooling efficiency.

Accordingly, to achieve the above objects, the present invention provides A flat evaporator comprising: a substrate having on the top surface a vaporization cavity region with a central chamber in which main evaporation of a liquid coolant occurs, a capillary region surrounding the central chamber, and a manifold region surrounding the capillary region; a top plate disposed on the substrate; a capillarity generator which is formed in the capillary region and flows the liquid coolant from the manifold region into the vaporization cavity region by capillary action; an exhaust unit which includes a gas collector and exhausts a gas coolant generated in the vaporization cavity region; a supplying unit which includes a coolant supply portion and supplies the liquid coolant from the outside to the manifold region; and an auxiliary capillarity generator having an extending portion extending towards the center of the vaporization cavity region between the top plate and the substrate.

In an alternative embodiment of the present invention, the capillarity generator may be formed of a porous body having a plurality of cavities. In another alternative embodiment, the capillarity generator may be formed of a plurality of wick structures, each having a square cross-section, densely arranged to provide a coolant flow gap between the manifold region and the vaporization cavity region.

It is preferable that the auxiliary capillarity generator has a ring-shaped body and is located on the capillarity generator. Preferably, the extending portion of the auxiliary capillarity generator is formed of a porous body capable of generating capillary action. More preferably, the entire auxiliary capillarity generator, both of the ring-shaped body and the extending portion, is formed of a porous body.

In another alternative embodiment, the auxiliary capillarity generator may be formed of an auxiliary wick structure where a ring-shaped body has an extending portion including a plurality of pins. Preferably, the pins of the auxiliary wick structure have a rectangular shape or include a circular extending portion at its rectangular front end. Preferably, the ring-shaped body of the auxiliary wick structure includes parts spaced a predetermined distance and interconnected by pins.

It is preferable that the gas collector is formed in the top plate and has a conical structure which tapers in an upward direction. Preferably, the gas collector comprises at least one stepped edge on the inner wall of the conical structure.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
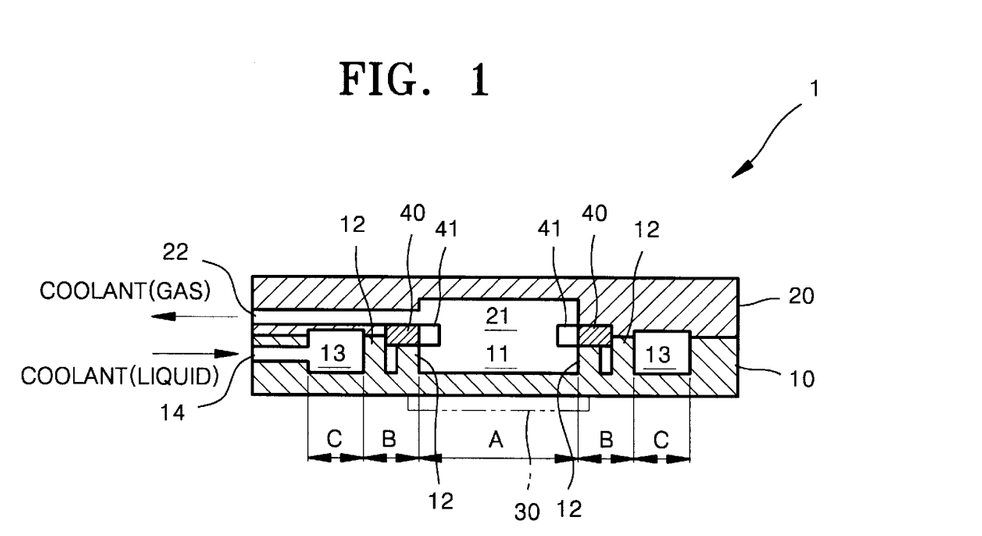
FIG. 1 is a cross-sectional view of a flat evaporator according to a first embodiment of the present invention.
Figure 2:
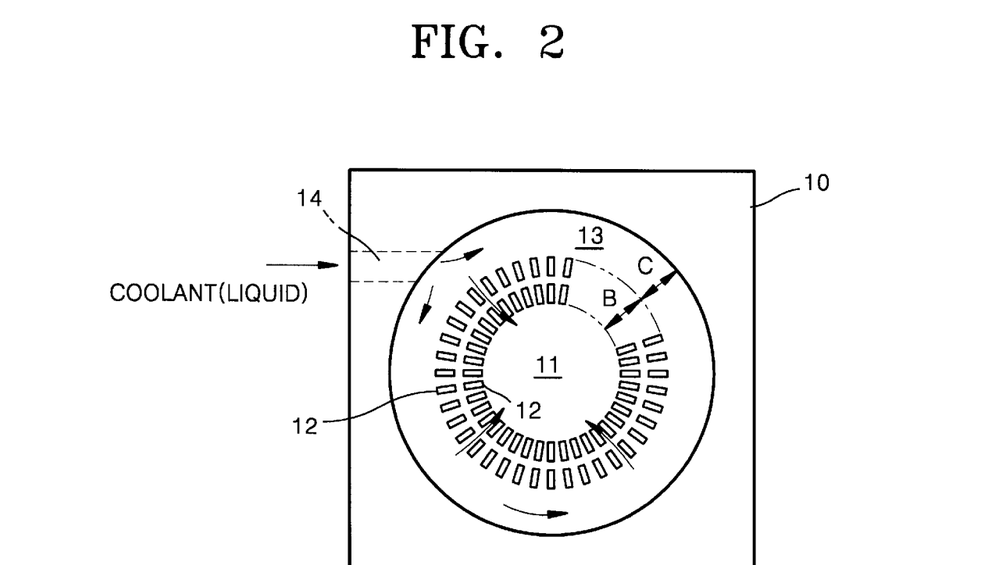
FIG. 2 is a top view of a substrate applied to the evaporator of FIG. 1.
Figure 3:
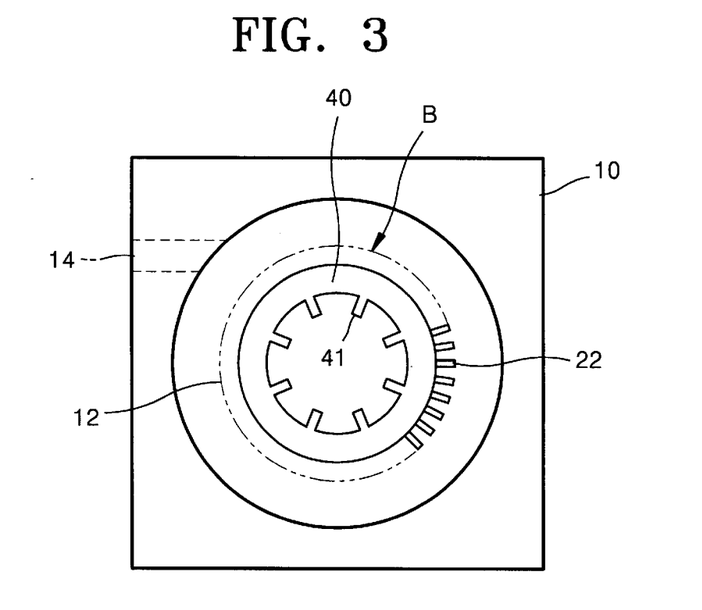
FIG. 3 is a top view of a substrate having a ring-shaped auxiliary wick-like structure, which is applied to the evaporator of FIG. 1.
Figure 7:
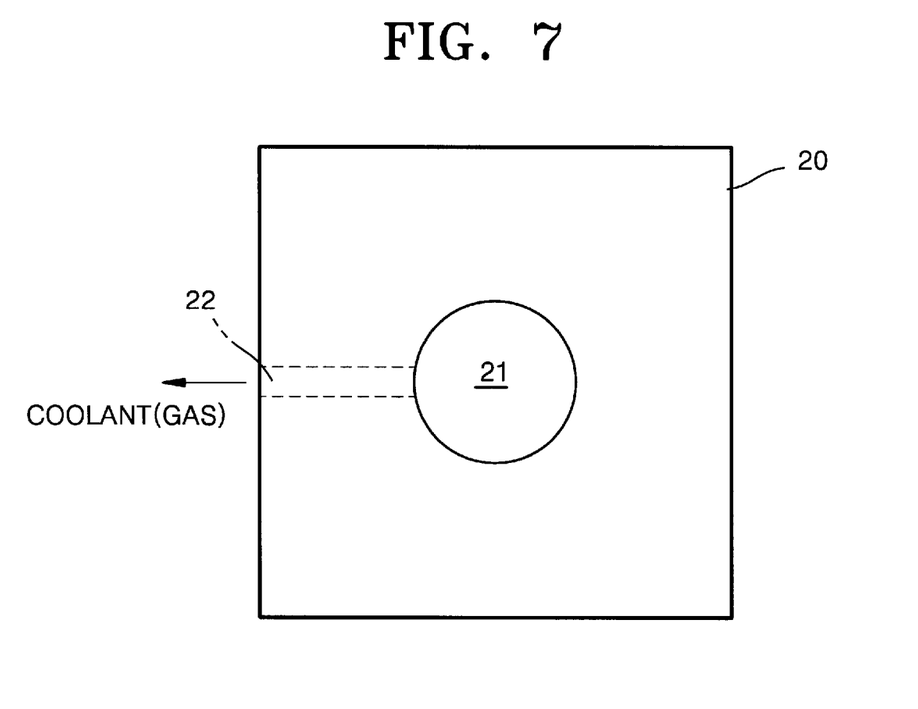
FIG. 7 is a bottom view of a top plate applied to the evaporator according to the present invention shown in FIGS. 1 and 4.

A first embodiment of a flat evaporator according to the present invention is shown in FIG. 1. A substrate 10 applied to the evaporator 1 shown in FIG. 1 is shown in FIG. 2. A ring-shaped auxiliary wick structure 40 acting as a capillarity generator and mounted into the substrate 10 of FIG. 2 is shown in FIG. 3. A top plate 20 applied to the evaporator of FIG. 1 according to the present invention is shown in FIG. 7, which is a bottom view of the top plate 20.

Referring to FIGS. 1 and 2, the evaporator 1 includes the substrate 10 and the top plate 20 stacked on the substrate 10. A common chamber is formed on the substrate 10 to a predetermined depth. The common chamber is divided into three regions: a vaporization cavity region A having a central chamber 11 in which main evaporation of a coolant occurs, an annular capillary region B surrounding the central chamber 11, and an annular manifold region C surrounding the capillary region B.

The vaporization cavity region A receives a coolant introduced through the capillary region B and vaporizes the coolant by heat supplied from a heat source 30 on the bottom of the substrate 10. The capillary region B surrounding the vaporization cavity region A has a capillarity generator capable of generating capillary action to draw in the coolant. The evaporator 1 according to the first embodiment of the present invention shown in FIGS. 1 and 2 is constructed so that a plurality of wick structures 12, each having a rectangular cross-section, are arranged in two rows in a radial direction from the vaporization cavity region A. The top of each wick structure 12 is in contact with the bottom of the top plate 20. The plurality of wick structures 12 provide a coolant flow gap between the manifold region and the vaporization cavity region. Here, the wick structure 12 may alternatively have a cross-section of a different shape, other than rectangle, capable of generating capillary action.

The manifold region C surrounding the capillary region B serves as a path along which a liquid coolant flows for evenly supplying the coolant to the capillary region B. The manifold region C is connected to a coolant inlet passage 14 formed on one side of the substrate 10. The coolant inlet passage 14 or a coolant supply passage can be formed in the top plate 20, instead of the substrate 10.

As shown in FIG. 7, a gas collector 21 corresponding to the central chamber 11 of the vaporization cavity region A is provided within the top plate 20 fixed onto the substrate 10. The gas collector 21 is connected to a coolant outlet passage 22 for outputting a gas coolant from the gas collector 21.

Referring to FIGS. 1 and 3, an auxiliary wick structure 40 is disposed at the top of the capillary region B. A plurality of pins 41 capable of generating capillary action are formed at an inside edge of the auxiliary wick structure 40. Each of the plurality of pins 41 extends toward the center of the central chamber 11 by a predetermined length. The auxiliary wick structure 40 is provided to supply a sufficient amount of coolant to the vaporization cavity region A, i.e, the central chamber 11, thereby suppressing dry out due to shortage of the coolant and increasing a coolant flow force along with the wick structures 12 of the capillary region B.

Figure 4:
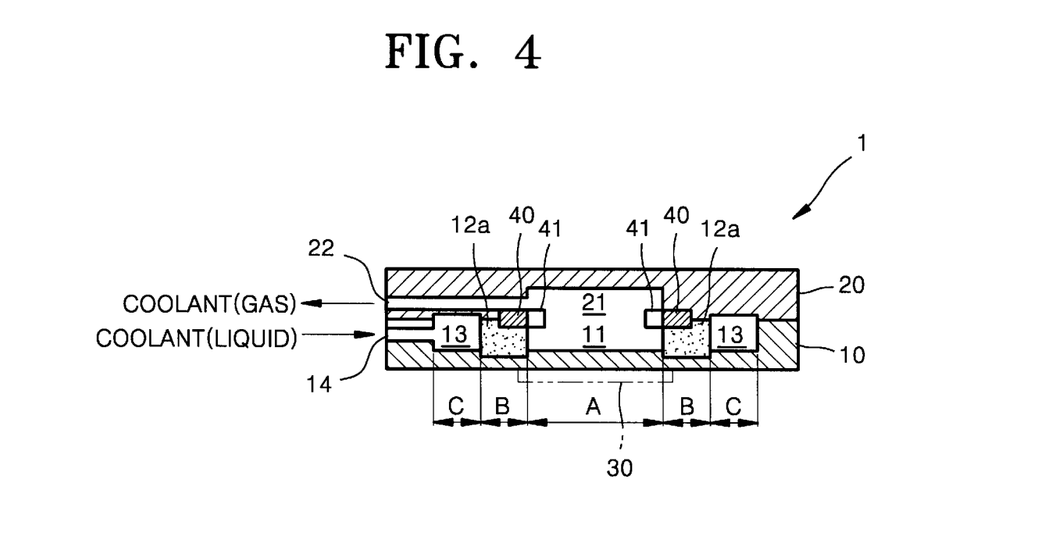
FIG. 4 is a cross-sectional view of a flat evaporator according to a second embodiment of the present invention.
Figure 5:
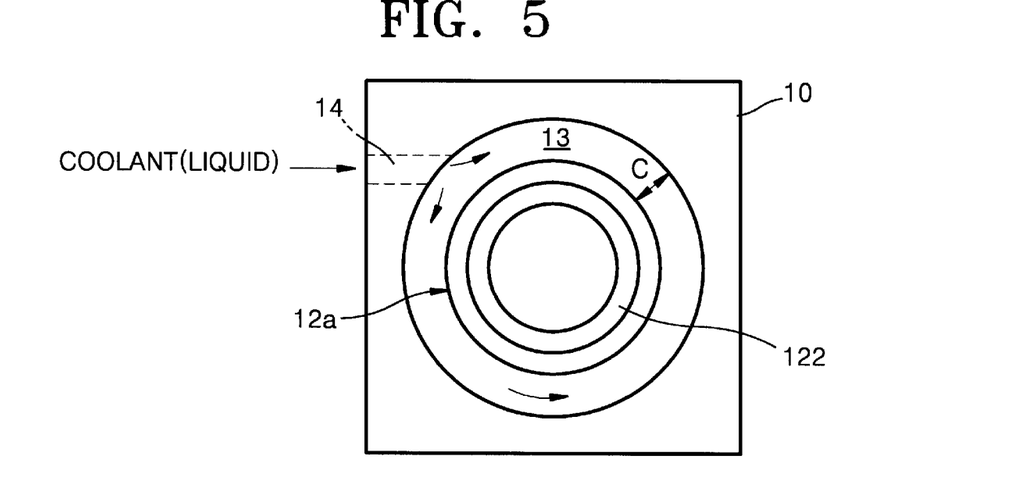
FIG. 5 is a top view of a substrate of the evaporator shown in FIG. 4 where a porous body is mounted.
Figure 6:
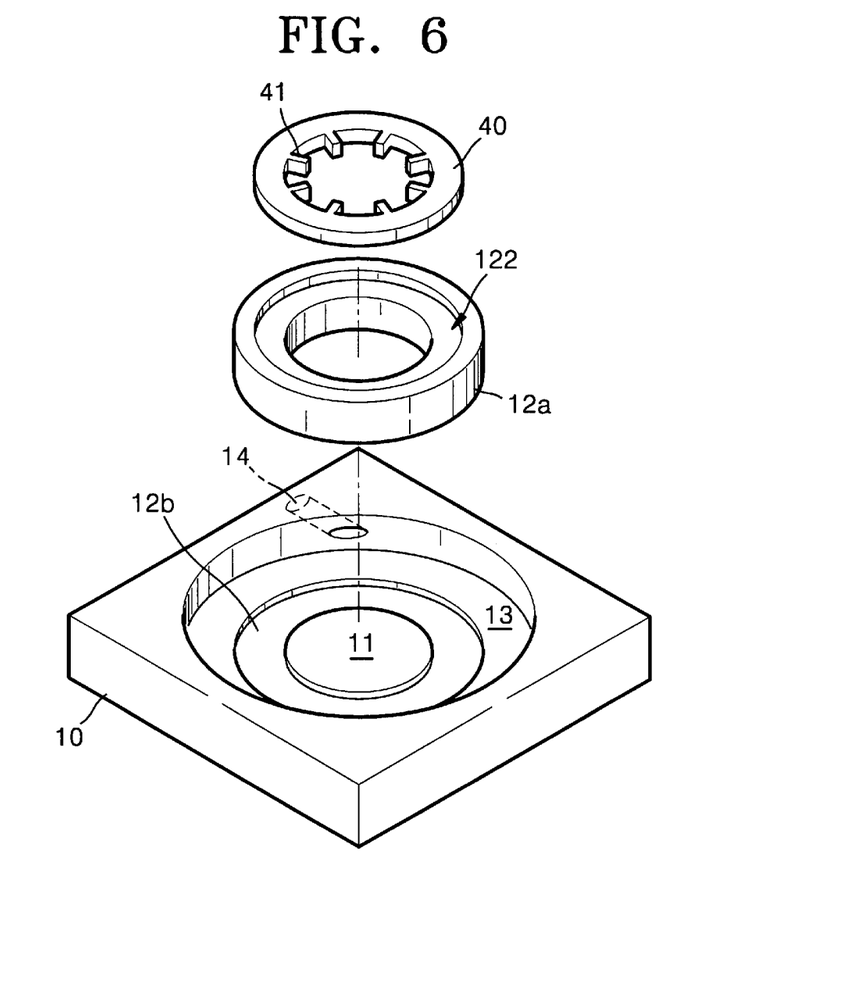
FIG. 6 is an exploded perspective view showing the combination of the substrate, the porous body, and an auxiliary wick-like structure, except for a top plate, in the evaporator shown in FIG. 4.

FIG. 4 is a cross-sectional view of a flat evaporator according to a second embodiment of the present invention, and FIG. 5 is a top view of a substrate 10 applied to the evaporator 1 of FIG. 4. FIG. 6 is an exploded perspective view showing the combination of the substrate 10, a ring-shaped porous body 12a acting as a capillarity generator, and an auxiliary wick structure 40 acting as an auxiliary capillarity generator, except for a top plate 20. FIG. 7 is a bottom view of the top plate 20 applied to the evaporator of FIGS. 4 and 1.

Referring to FIGS. 4 through 6, in the flat evaporator according to the second embodiment of the present invention, the wick structure 12 is replaced by the ring-shaped porous body 12. The ring-shaped porous body 12 acts as a capillarity generator, like the wick structure 12 described above, and is provided in the capillary region B. The ring-shaped porous body 12a flows a coolant from the manifold region C to the vaporization cavity region A by capillary action. A ring-shaped recess 122 is formed in the top surface of the porous body 12a to receive the auxiliary wick structure 40 acting as the auxiliary capillarity generator thereon.

A ring-shaped recess 121 is formed at the bottom surface of the capillary region B of the substrate 10 to receive the ring-shaped porous body 12a thereon. The two ring-shaped recesses 121 and 122 determine and fix the positions of the porous body 12a and the auxiliary wick structure 40 in the substrate 20, but they are optional elements.

In an alternative embodiment, the porous body 12a and the auxiliary wick structure 40 can be combined into a single body. The combination of porous body-auxiliary wick structure can be formed by powder metallurgy through molding and sintering of metallic powder. Accordingly, both of the porous body 12a and the auxiliary wick structure 40 can be formed of porous materials capable of generating capillary action.

A flat evaporator according to the present invention having any structure described above has the following features. First, a coolant is supplied to the vaporization cavity region A situated at the center of the substrate 10 from the neighborhood thereof. That is, the coolant flows parallel to the plane of the substrate 10 and collects in the central chamber 11 of the substrate 10. Second, the capillary region B for drawing in the coolant surrounds the vaporization cavity region A, and the manifold region C surrounds the capillary region B so as to evenly supply the coolant to the entire capillary region B. Third, the auxiliary wick structure 40 is disposed at the top of the capillary region B.

Here, a flow force of the coolant is generated at a portion where phase change of the coolant occurs, in particular, at the inner end of the capillary region B being in contact with the central chamber 11. In the above construction, the top of the manifold region C is sealed by the bottom of the top plate 20 so that the coolant entering the manifold region C flows only into the capillary region B.

In the above construction, the vaporization cavity region A preferably has an area corresponding to the size (area) of a heat source 30. A region including the vaporization cavity region A and the capillary region B may have an area corresponding to the size of the heat source 30 depending on the type of application.

As shown in FIG. 7, the gas collector 21 corresponding to the central chamber 11 of the vaporization cavity region A is provided within the top plate 20 fixed onto the substrate 10. The gas collector 21 is connected to the coolant outlet passage 22 for outputting a gas coolant from the gas collector 21.

Figure 8:
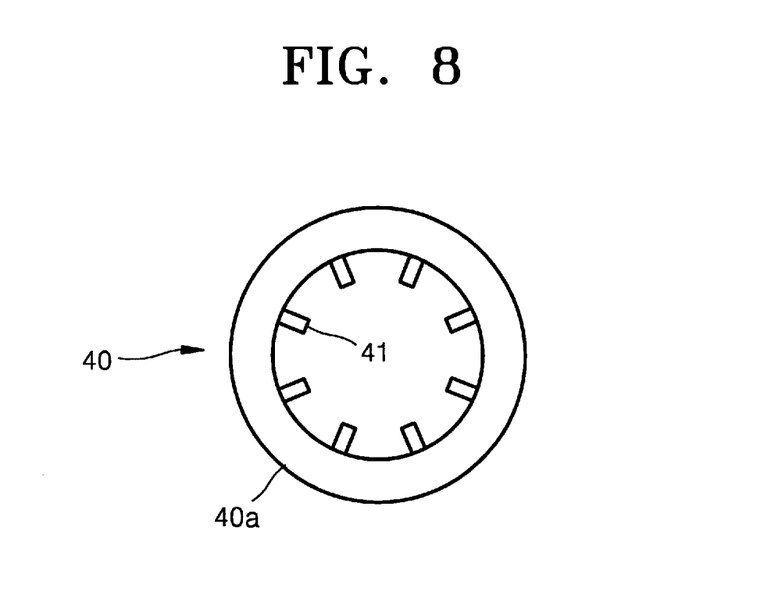
FIG. 8 is a top view of an embodiment of a ring-shaped auxiliary wick structure applied to a flat evaporator according to the present invention.
Figure 9:
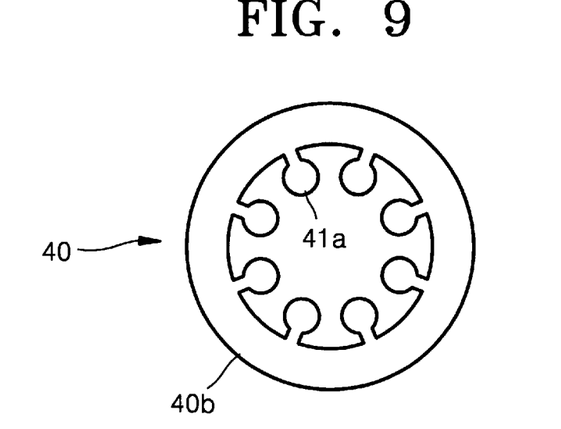
FIG. 9 is a top view of another embodiment of a ring-shaped auxiliary wick structure applied to a flat evaporator according to the present invention.
Figure 10:
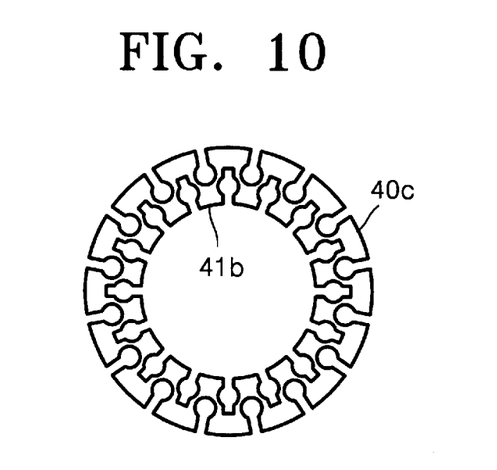
FIG. 10 is a top view of another embodiment of a ring-shaped auxiliary wick structure applied to a flat evaporator according to the present invention.

FIGS. 8–11 show various modified examples of the auxiliary wick structure 40 acting as an auxiliary capillary generator. Referring to FIG. 8, the auxiliary wick structure 40 is configured so that a plurality of rectangular pins 41 extending toward the center of a ring-shaped body 40a are formed along the inner circumference of the ring-shaped body 40a. Referring to FIG. 9, the auxiliary wick structure 40 is configured so that a plurality of pins 41a, each having a circular extending portion at a rectangular front end, are formed along the inner circumference of a ring-shaped body 41b. Referring to FIG. 10, the auxiliary wick structure 40 is configured so that a ring-shaped body 40c is divided into a plurality of spaced parts, and that the plurality of parts are connected by a plurality of "A"-shaped pins 41b through which a coolant flows, each having a through hole and curved edges.

The pins 41, 41a, or 41b of the auxiliary wick structure 40 enable the coolant to be transported from the manifold region C and the capillary region B to the central portion of the central chamber 11 by surface tension. In this case, the pins 41, 41a, or 41b are arranged at regular intervals, thereby enabling a gas generated in the central chamber 11 to rise to the gas collector 21 of the top plate 20 without suffering from high fluid resistance.

Figure 11:
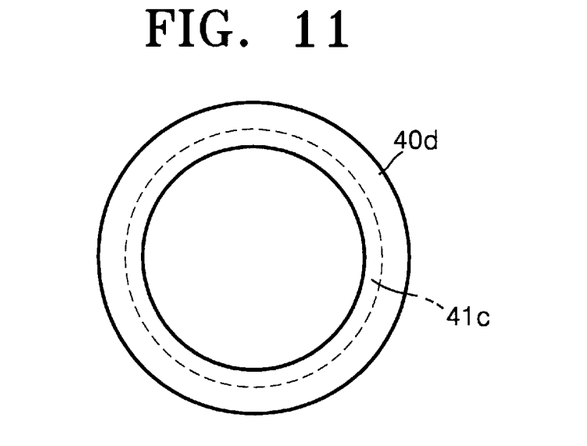
FIG. 11 is a top view of another embodiment of a ring-shaped auxiliary wick structure applied to a flat evaporator according to the present invention.

FIG. 11 shows another example of the auxiliary capillarity generator having a ring-shaped porous body 40d. The entire body of the auxiliary capillarity generator can be formed of aporous material. Alternatively, only a portion 41c of the auxiliary capillarity generator overlapping with the central chamber 11, i.e., corresponding to the pins 41, 41a, and 41b described above, can be formed of a porous material. When the entire auxiliary capillarity generator and the capillarity generator of the capillary region B, as shown in FIG. 4, are formed of porous materials, these two capillarity generators can be formed as a single body by powder metallurgy.

Figure 12:
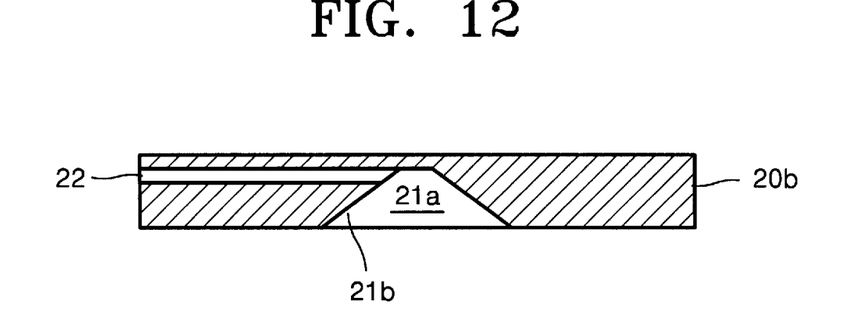
FIG. 12 is a cross-sectional view showing an example of a top plate applied to a flat evaporator according to the present invention.
Figure 13:
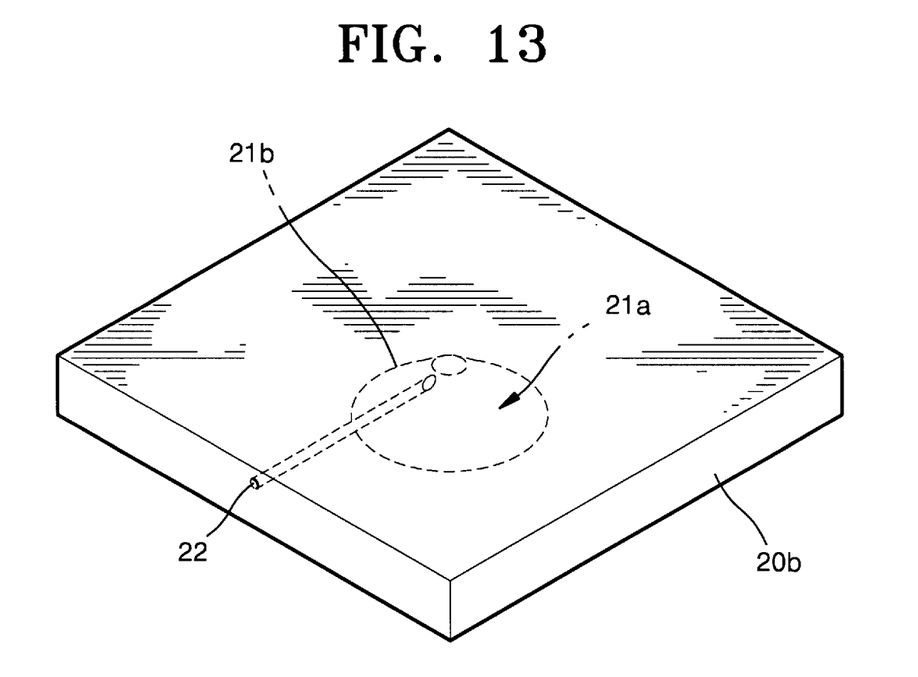
FIG. 13 is a perspective view of the top plate of FIG. 8.

FIGS. 12 and 13 are a cross-sectional view and a perspective view of another embodiment of a top plate 20b having a gas collector 21a formed by a conical groove 21b, respectively. The gas collector 21a is formed by the conical groove 21b, thereby effectively collecting gas generated from the central chamber 11 of the substrate 10 and outputting the gas through the coolant outlet passage 22 disposed at the top of the gas collector 21a. Furthermore, if a large amount of coolant that is not fully vaporized in the central chamber 11 is introduced into the gas collector 21a, the gas collector 21a returns the coolant not fully vaporized to the central chamber 11 by narrowing a flow path by the groove 21b having a slopping wall.

Figure 14:
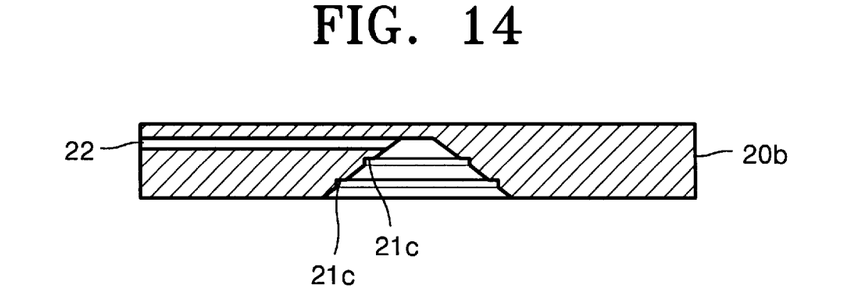
FIG. 14 is a cross-section view showing another example of a top plate applied to a flat evaporator according to the present invention.

FIG. 14 is a cross-sectional view of still another embodiment of a top plate 20b having a gas collector 21a formed by a conical groove 21b whose surface has two stepped edges 21c. As shown in FIG. 14, the side of the groove 21b has the upper and lower stepped edges 21c. That is, each of the stepped edges 21c is formed along the surface of the groove 21b in the form of an annulus.

Thus, if an amount of coolant not fully vaporized is introduced into the gas collector 21a, the gas collector 21a returns the unvaporized coolant to the central chamber 11 by narrowing a flow path of the coolant by the groove 21b having a slopping wall. Furthermore, the stepped edges 21c formed on the slipping wall of the groove 21b reduce gas-to-liquid interfacial tension of the coolant in the central chamber 11 to be less thermally resistive, thereby improving evaporation efficiency.

An evaporator according to the present invention can vary depending on its usage. For example, if an evaporator is installed in a very small space such as a notebook computer, a micro-electromechanical system (MEMS) technology using a silicon wafer and the like is applied to fabricate the evaporator. Employing MEMS fabrication technology can miniaturize the overall structure of an evaporator, in particular, a wick structure, to generate a very strong capillary force. In this case, the substrate is obtained from a semiconductor substrate, and the processing on the substrate involves a patterning process using MEMS technology.

The present invention can provide for a small and thin cooling device for performing cooling without external power. Furthermore, the present invention can effectively prevent the degradation of fluid flow force due to coexistence of gas and liquid by isolating a liquid coolant from a vaporized coolant by a capillary region, thereby significantly improving heat exchange characteristics.

An evaporator according to the present invention is suitable for cooling devices for small-sized parts of an electronic device such as a computer CPU, as described above. In particular, an evaporator can be attached to a CPU itself, which is a heat source in an electronic device, having a small usable volume such as a notebook computer, thereby preventing an increase in the size and weight of a notebook computer due to a separate cooling device.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A flat evaporator comprising:
   a substrate having on the top surface a vaporization cavity region with a central chamber in which main evaporation of a liquid coolant occurs, a capillary region surrounding the central chamber, and a manifold region surrounding the capillary region;
   a top plate disposed on the substrate;
   a capillarity generator which is formed in the capillary region and flows the liquid coolant from the manifold region into the vaporization cavity region by capillary action;

an exhaust unit which includes a gas collector and exhausts a gas coolant generated in the vaporization cavity region;

a supplying unit which includes a coolant supply portion and supplies the liquid coolant from the outside to the manifold region; and an auxiliary capillarity generator having an extending portion extending towards the center of the vaporization cavity region between the top plate and the substrate.

2. The flat evaporator of claim 1, wherein a coolant inlet passage extends from one side of the substrate or the top plate to the manifold region, and a coolant output passage extends from one side of the top plate to the gas collector.

3. The flat evaporator of claim 1, wherein the auxiliary capillarity generator has a ring-shaped body and is located on the capillarity generator.

4. The flat evaporator of claim 1, wherein the extending portion of the auxiliary capillarity generator comprises a plurality of rectangular pins or a plurality of pins each having a circular extending portion at its rectangular front end.

5. The flat evaporator of claim 3, wherein the extending portion of the auxiliary capillarity generator comprises a plurality of rectangular pins or a plurality of pins each having a circular extending portion at its rectangular front end.

6. The flat evaporator of claim 1, wherein the auxiliary capillarity generator is formed of an auxiliary wick structure having a ring-shaped body including parts spaced a predetermined distance and interconnected by pins.

7. The flat evaporator of claim 3, wherein the auxiliary capillarity generator is formed of an auxiliary wick structure having a ring-shaped body including parts spaced a predetermined distance and interconnected by pins.

8. The flat evaporator of claim 1, wherein the gas collector is formed in the top plate and has a conical structure which tapers in an upward direction.

9. The flat evaporator of claim 3, wherein the gas collector is formed in the top plate and has a conical structure which tapers in an upward direction.

10. The flat evaporator of claim 8, wherein the gas collector comprises at least one stepped edge on the inner wall of the conical structure.

11. The flat evaporator of claim 9, wherein the gas collector comprises at least one stepped edge on the inner wall of the conical structure.

12. The flat evaporator of claim 1, wherein the capillarity generator is formed of a porous body having a plurality of cavities.

13. The flat evaporator of claim 12, wherein the auxiliary capillarity generator has a ring-shaped body and is located on the capillarity generator.

14. The flat evaporator of claim 11, wherein the extending portion of the auxiliary capillarity generator comprises a plurality of rectangular pins or a plurality of pins each having a circular extending portion at its rectangular front end.

15. The flat evaporator of claim 2, wherein the auxiliary capillarity generator has a ring-shaped body and is located on the capillarity generator.

16. The flat evaporator of claim 2, wherein the extending portion of the auxiliary capillarity generator comprises a plurality of rectangular pins or a plurality of pins each having a circular extending portion at its rectangular front end.

17. The flat evaporator of claim 2, wherein the auxiliary capillarity generator is formed of an auxiliary wick structure having a ring-shaped body including parts spaced a predetermined distance and interconnected by pins.

18. The flat evaporator of claim 2, wherein the gas collector is formed in the top plate and has a conical structure which tapers in an upward direction.

19. The flat evaporator of claim 2, wherein the capillarity generator is formed of a porous body having a plurality of cavities.

20. The flat evaporator of claim 12, wherein the extending portion of the auxiliary capillarity generator comprises a plurality of rectangular pins or a plurality of pins each having a circular extending portion at its rectangular front end.

* * * * *